United States Patent
Kim et al.

(10) Patent No.: US 8,912,063 B2
(45) Date of Patent: Dec. 16, 2014

(54) SEMICONDUCTOR DEVICE HAVING BLOCKING PATTERN AND METHOD FOR FABRICATING THE SAME

(71) Applicant: Samsung Electronics Co., Ltd., Suwon-si, Gyeonggi-Do (KR)

(72) Inventors: Jin-Bum Kim, Seoul (KR); Ha-Kyu Seong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/829,761

(22) Filed: Mar. 14, 2013

(65) Prior Publication Data

US 2014/0273359 A1    Sep. 18, 2014

(51) Int. Cl.
  *H01L 21/336*   (2006.01)
  *H01L 29/66*    (2006.01)

(52) U.S. Cl.
  CPC ............................... *H01L 29/66795* (2013.01)
  USPC ........................... 438/268; 438/212; 257/327

(58) Field of Classification Search
  None
  See application file for complete search history.

(56) References Cited

U.S. PATENT DOCUMENTS

| 7,348,641 | B2* | 3/2008 | Zhu et al. ....................... 257/401 |
| 8,138,030 | B2  | 3/2012 | Chang et al. |
| 2005/0199948 | A1 | 9/2005 | Lee et al. |
| 2006/0175669 | A1* | 8/2006 | Kim et al. ...................... 257/401 |
| 2006/0216880 | A1 | 9/2006 | Suto |
| 2009/0026505 | A1 | 1/2009 | Okano |
| 2010/0052059 | A1 | 3/2010 | Lee |
| 2010/0099241 | A1 | 4/2010 | Murano et al. |
| 2011/0147846 | A1 | 6/2011 | Su et al. |
| 2011/0248348 | A1 | 10/2011 | Gan et al. |
| 2011/0291188 | A1 | 12/2011 | Cheng et al. |
| 2011/0298058 | A1 | 12/2011 | Kawasaki et al. |
| 2012/0012932 | A1 | 1/2012 | Perng et al. |
| 2012/0025316 | A1 | 2/2012 | Schultz |
| 2012/0153397 | A1 | 6/2012 | Cheng et al. |
| 2013/0200468 | A1* | 8/2013 | Cai et al. ........................ 257/401 |

FOREIGN PATENT DOCUMENTS

| KR | 10-2009-0114151 | 11/2009 |
| KR | 10-2012-0048903 | 5/2012 |

OTHER PUBLICATIONS

English Abstract for Publication No. 10-2009-0114151.
English Abstract for Publication No. 10-2012-0048903.

* cited by examiner

*Primary Examiner* — Andres Munoz
(74) *Attorney, Agent, or Firm* — F. Chau & Associates, LLC

(57) ABSTRACT

A method for fabricating a semiconductor device is provided. The method includes forming a gate pattern which intersects a fin-type active pattern protruding upward from a device isolation layer. A first blocking pattern is formed on a portion of the fin-type active pattern, which does not overlap the gate pattern. Side surfaces of the portion of the fin-type active pattern are exposed. A semiconductor pattern is formed on the exposed side surfaces of the portion of the fin-type active pattern after the forming of the first blocking pattern.

19 Claims, 18 Drawing Sheets

SEMICONDUCTOR DEVICE HAVING BLOCKING PATTERN AND METHOD FOR FABRICATING THE SAME

BACKGROUND

1. Technical Field

Embodiments of the present invention relate to a semiconductor device, and more particularly, to a semiconductor device and a method of fabricating the same.

2. Discussion of the Related Art

The density of semiconductor devices may be increased by adopting multi-gate transistors, which are obtained by forming a fin-shaped silicon body on a substrate and by forming gates on the surface of the silicon body.

Multi-gate transistors that have three-dimensional (3D) channels may be easily scaled to include additional transistors. In addition, the current control capability of multi-gate transistors can be increased without the need to increase the gate length. Moreover, a short channel effect (SCE), which is the phenomenon by which the electric potential in a channel region is affected by a drain voltage, can be effectively suppressed.

SUMMARY

According to an exemplary embodiment of the present invention, there is provided a method for fabricating a semiconductor device. The method comprises forming a gate pattern which intersects a fin-type active pattern protruding upward from a device isolation layer. A first blocking pattern is formed on a portion of the fin-type active pattern, which does not overlap the gate pattern, to expose side surfaces of the portion of the fin-type active pattern. A semiconductor pattern is formed on the exposed side surfaces of the portion of the fin-type active pattern after the forming of the first blocking pattern.

According to an exemplary embodiment of the present invention, there is provided a method for fabricating a semiconductor device. The method comprises forming a fin-type active pattern which extends in a first direction and protrudes upward from a device isolation layer. The fin-type active pattern comprises a first region and a second region disposed on both sides of the first region. The method comprises forming a gate pattern which extends in a second direction different from the first direction and overlaps the first region of the fin-type active pattern. A first blocking pattern which exposes side surfaces of the second region of the fin-type active pattern and covers a top surface of the second region of the fin-type active pattern is formed. A source/drain is formed by selectively growing an epitaxial layer on the side surfaces of the second region of the fin-type active pattern after the forming of the first blocking pattern.

BRIEF DESCRIPTION OF THE DRAWINGS

The above and features of the present invention will become more apparent by describing in detail exemplary embodiments thereof with reference to the attached drawings, in which.

DETAILED DESCRIPTION OF THE EXEMPLARY EMBODIMENTS

Exemplary embodiments of the present invention will now be described more fully hereinafter with reference to the accompanying drawings. This invention may, however, be embodied in different forms and should not be construed as limited to the embodiments set forth herein. It will be understood that when an element or layer is referred to as being "on," "connected to," or "coupled to" another element or layer, it can be directly on, connected to or coupled to another element or layer or intervening elements or layers may be present. Like numbers may refer to like or similar elements throughout the specification and the drawings. As used herein, the term "and/or" includes any and all combinations of one or more of the associated listed items.

The use of the terms "a" and "an" and "the" and similar referents in the context of describing the invention (especially in the context of the following claims) are to be construed to cover both the singular and the plural, unless otherwise indicated herein or clearly contradicted by context.

A semiconductor device according to an exemplary embodiment of the present invention will now be described with reference to FIG. 1.

Figure 1:
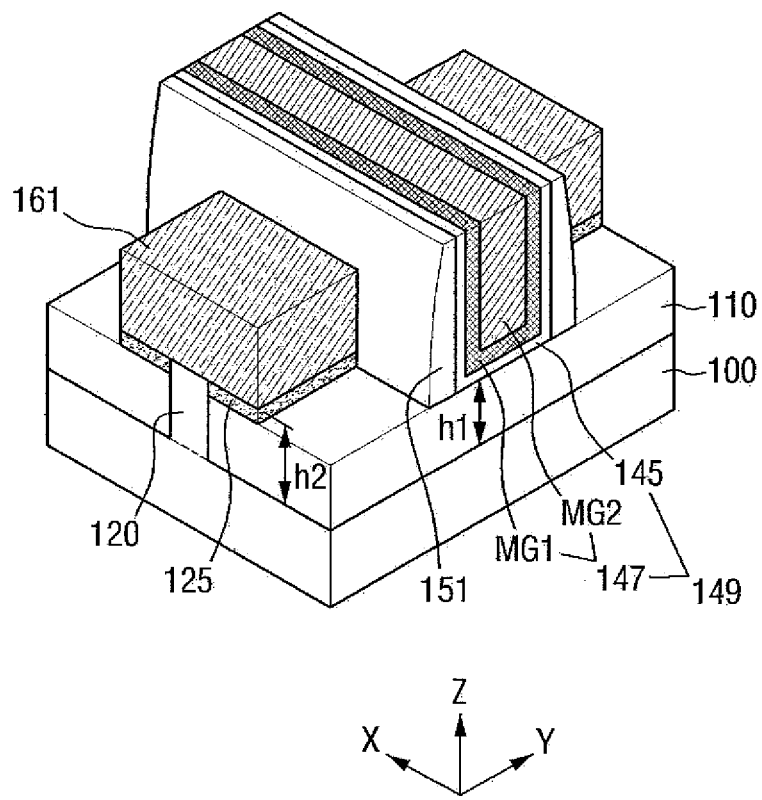
FIG. 1 is a view illustrating a semiconductor device according to an exemplary embodiment of the present invention.

FIG. 1 is a view illustrating a semiconductor device 10 according to an exemplary embodiment of the present invention.

FIG. 1 illustrates a gate pattern 149 and a source/drain 161 formed on a device isolation layer 110. Interlayer insulating films are not illustrated.

Referring to FIG. 1, the semiconductor device 10 may include a fin-type active pattern 120, the gate pattern 149, the source/drain 161, and a fin spacer 125.

The fin-type active pattern 120 protrudes from a substrate 100. The fin-type active pattern 120 may extend along a second direction Y. The fin-type active pattern 120 may be part of the substrate 100 or may include an epitaxial layer grown from the substrate 100. The substrate 100 may be, e.g., a bulk silicon substrate or a silicon-on-insulator (SOI) substrate. The substrate 100 may be a silicon substrate or a substrate made of a material, such as silicon germanium, indium antimonide, lead telluride, indium arsenide, indium phosphide, gallium arsenide, or gallium antimonide. Alternatively, the substrate 100 may include a base substrate and an epitaxial layer formed on the base substrate. For the purposes of description, the substrate 100 may be referred to herein as a silicon substrate however other substrates may be used.

The device isolation layer 110 may cover side surfaces of a lower part of the fin-type active pattern 120. The device isolation layer 110 may be interposed between the substrate 100 and the gate pattern 149 and between the substrate 100 and the source/drain 161 and may contact the lower part of the fin-type active pattern 120. The device isolation layer 110 may include a silicon oxide layer, a silicon nitride layer, and/or a silicon oxynitride layer.

The gate pattern 149 may be formed on the substrate 100 and may intersect the fin-type active pattern 120. The gate pattern 149 may be formed on the device isolation layer 110 and may partially overlap the fin-type active pattern 120. For example, the gate pattern 149 may extend along a first direction X. The gate pattern 149 may include a gate electrode 147 and a gate insulating layer 145.

The gate electrode 147 may include first and second metal layers MG1 and MG2. As illustrated in FIG. 1, the gate electrode 147 may include a stack of two or more metal layers (for example, the first and second metal layers MG1 and MG2). The first metal layer MG1 adjusts a work function, and the second metal layer MG2 fills the space formed by the first metal layer MG1. For example, the first metal layer MG1 may include TiN, TaN, TiC and/or TaC, and the second metal layer MG2 may include W or Al. The gate electrode 147 may also be formed of a material other than a metal, such as Si or SiGe. As an example, the gate electrode 147 may be formed by, but is not limited to being formed by, a replacement process.

The gate insulating layer 145 may be formed between the fin-type active pattern 120 and the gate electrode 147. The gate insulating layer 145 may be formed on top and side surfaces of the fin-type active pattern 120. The gate insulating layer 145 may be disposed between the gate electrode 147 and the device isolation layer 110. The gate insulating layer 145 may include a silicon oxide layer, a silicon nitride layer, a silicon oxynitride layer, or a high-k material having a higher dielectric constant than the silicon oxide layer. The gate insulating layer 145 containing the high-k material may include, but is not limited to including hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The source/drain 161 is formed on both sides of the gate pattern 149. The source/drain 161 is formed on portions of the fin-type active pattern 120 which are exposed by the device isolation layer 110. The source/drain 161 may be formed as an elevated source/drain. A top surface of the source/drain 161 may be higher than a top surface of the device isolation layer 110. The source/drain 161 and the gate pattern 149 may be insulated from each other by a gate spacer 151.

In FIG. 1, the source/drain 161 is rectangular. However, the shape of the source/drain 161 is not limited to the rectangular shape. For example, the source/drain 161 may also be, e.g., hexagonal.

In FIG. 1, the source/drain 161 is illustrated as one semiconductor pattern. However, the source/drain 161 includes a portion of the fin-type active pattern 120 which protrudes upward from the device isolation layer 110 and an epitaxial layer formed on the side surfaces of the fin-type active pattern 120. This will be described in more detail later in relation to a method of fabricating a semiconductor device.

The source/drain 161 may include substantially the same material as the fin-type active pattern 120. For example, when the fin-type active pattern 120 includes silicon, the source/drain 161 may also include silicon. The source/drain 161 includes, e.g., p-type impurities or n-type impurities according to whether the semiconductor device 10 is a p-channel metal oxide semiconductor (PMOS) fin-type transistor or an n-channel metal oxide semiconductor (NMOS) fin-type transistor.

The fin spacer 125 is interposed between the device isolation layer 110 and the source/drain 161. The fin spacer 125 partially contacts the side surfaces of the fin-type active pattern 120 which protrudes upward from the device isolation layer 110. In FIG. 1, the fin spacer 125 is completely overlapped by the source/drain 161. However, exemplary embodiments of the present invention are not limited thereto. For example, the overlap between the fin spacer 125 and the source/drain 161 may vary according to a method of fabricating a semiconductor device.

Like the fin-type active pattern 120, the fin spacer 125 may extend along the second direction Y. The fin spacer 125 may include a silicon oxide layer, a silicon nitride layer, and/or a silicon oxynitride layer. The fin spacer 125 may be formed of, but is not limited to being formed of, a different material from the interlayer insulating film which covers the device isolation layer 110 and the source/drain 161.

The gate spacer 151 may be formed on side surfaces of the gate pattern 149. The gate spacer 151 may include a nitride layer and/or an oxynitride layer.

In the semiconductor device 10 according to an exemplary embodiment of the present invention, a height from the substrate 100 to a bottom surface of the gate pattern 149 is different from a height from the substrate 100 to a bottom surface of the source/drain 161.

The height from the substrate 100 to the bottom surface of the gate pattern 149 is a first height h1, and the height from the substrate 100 to the bottom surface of the source/drain 161 is a second height h2. The bottom surface of the gate pattern 149 is a contact surface between the gate insulating layer 145 and the device isolation layer 110. The first height h1 from the substrate 100 to the bottom surface of the gate pattern 149 is substantially equal to a thickness of the device isolation layer 110. The bottom surface of the source/drain 161 is a contact surface between the source/drain 161 and the fin spacer 125. The second height h2 from the substrate 100 to the bottom surface of the source/drain 161 is substantially equal to the sum of the thickness of the device isolation layer 110 and a thickness of the fin spacer 125.

Due to the fin spacer 125 located between the source/drain 161 and the device isolation layer 110, the second height h2 from the substrate 100 to the bottom surface of the source/drain 161 is greater than the first height h1 from the substrate 100 to the bottom surface of the gate pattern 149. A difference between the second height h2 from the substrate 100 to the bottom surface of the source/drain 161 and the first height h1 from the substrate 100 to the gate pattern 149 is substantially equal to the thickness of the fin spacer 125.

A method of fabricating a semiconductor device according to an exemplary embodiment of the present invention is now described with reference to FIGS. 2 through 13.

FIGS. 2 through 13 are views illustrating steps of a method of fabricating a semiconductor device according to an exemplary embodiment of the present invention.

Figure 2:
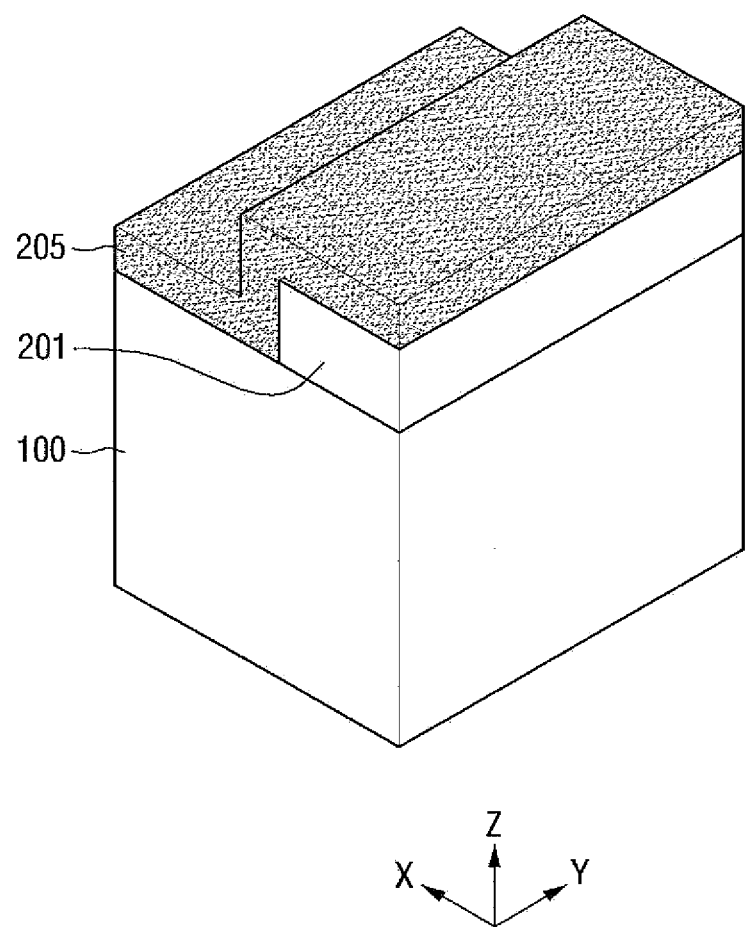
FIGS. 2 through 13 are views illustrating steps of a method of fabricating a semiconductor device according to an exemplary embodiment of the present invention.

Referring to FIG. 2, a first mask pattern 201 may be formed on a substrate 100. A mask layer 205 may be formed on the substrate 100 having the first mask pattern 201 formed thereon. The mask layer 205 may be aligned on a top surface of the substrate 100 having the first mask pattern 201.

The first mask pattern 201 and the mask layer 205 may respectively include materials having etch selectivity with respect to each other. For example, the mask layer 205 may include silicon oxide, silicon nitride, silicon oxynitride, a metal layer, photoresist, spin on glass (SOG), and/or spin on hard mask (SOH). The first mask pattern 201 may be formed of a material different from that of the mask layer 205 and may include silicon oxide, silicon nitride, silicon oxynitride, a metal layer, photoresist, spin on glass (SOG), and/or spin on hard mask (SOH).

The first mask pattern 201 and the mask layer 205 may be formed by a physical vapor deposition (PVD) process, a chemical vapor deposition (CVD) process, an atomic layer deposition (ALD) process, and/or a spin coating method.

Figure 3:
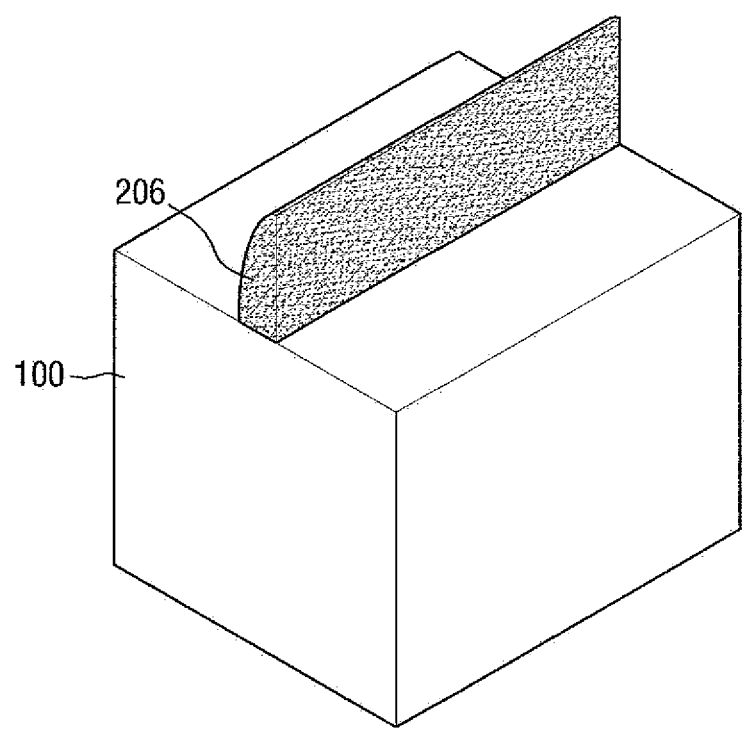

Referring to FIG. 3, a second mask pattern 206 may be formed by etching the mask layer 205. The second mask pattern 206 may be a spacer which exposes the first mask pattern 201. The first mask pattern 201 exposed by the second mask pattern 206 is removed to thus expose the substrate 100 at both sides of the second mask pattern 206.

Removing the first mask pattern 201 may include a selective etching process which can remove the first mask pattern 201 and which can minimize the etching of the second mask pattern 206.

Figure 4:
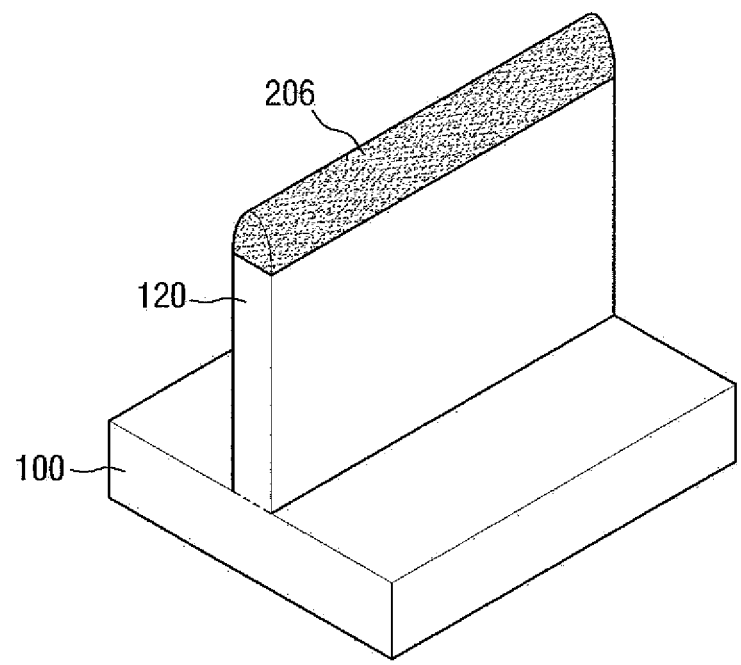

Referring to FIG. 4, the substrate 100 is partially etched using the second mask pattern 206 as an etch mask. Thus, a fin-type active pattern 120 is formed on the etched substrate 100, and recesses are formed at both sides of the fin-type active pattern 120. The fin-type active pattern 120 may extend along a second direction Y.

In FIG. 4, the fin-type active pattern 120 is illustrated as being substantially perpendicular to the top surface of the substrate 100. However, exemplary embodiments of the present invention are not limited thereto. For example, the fin-type active pattern 120 can have sloping side surfaces, and thus, the fin-type active pattern 120 may be tapered.

Figure 5:
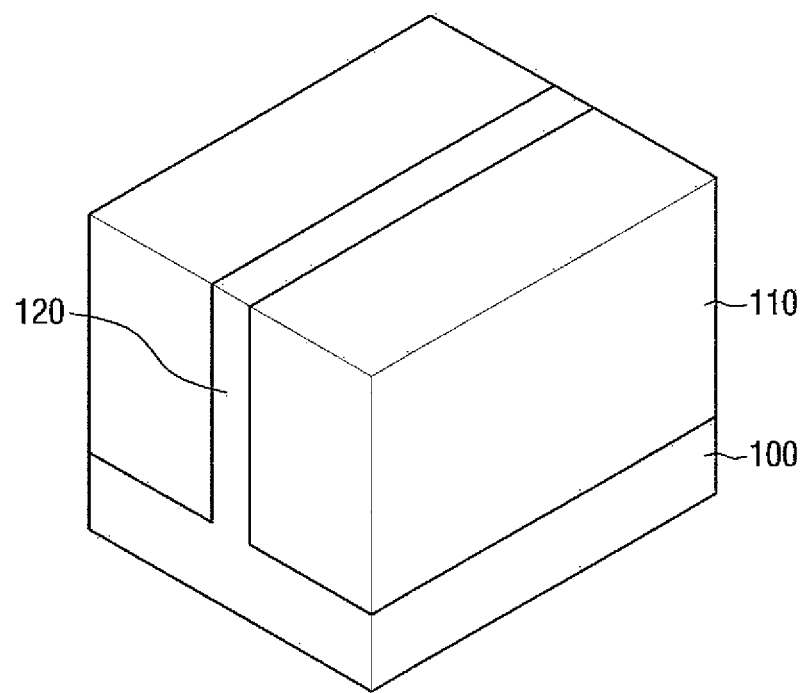

Referring to FIG. 5, a device isolation layer 110 fills the recesses. The device isolation layer 110 may be formed of a material that includes a silicon oxide layer, a silicon nitride layer, and/or a silicon oxynitride layer.

The fin-type active pattern 120 and the device isolation layer 110 may be made to lie in the same plane by a planarization process. For example, the fin-type active pattern 120 may be coplanar with the device isolation layer 110. The second mask pattern 206 may be removed during the planarization process. However, exemplary embodiments of the present invention are not limited thereto. For example, the second mask pattern 206 may also be removed before the formation of the device isolation layer 110 or after a recess process which is later described with reference to FIG. 6.

Figure 6:
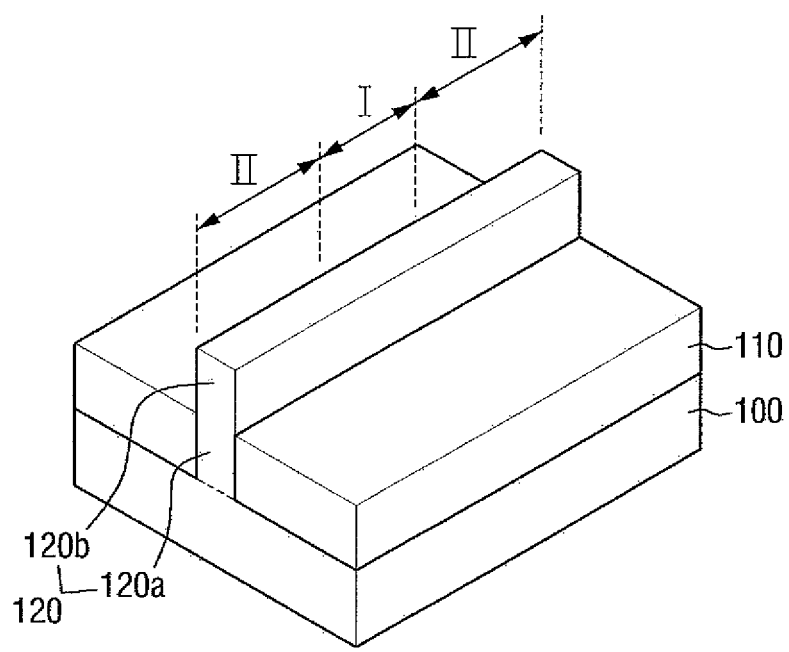

Referring to FIG. 6, an upper part 120b of the fin-type active pattern 120 is exposed by performing a recessing process on an upper part of the device isolation layer 110. The recessing process may include a selective etching process. The fin-type active pattern 120 protrudes upward from the device isolation layer 110.

As a result of the recess process, the device isolation layer 110 covers a lower part 120a of the fin-type active pattern 120 and exposes the upper part 120b of the fin-type active pattern 120.

The upper part 120b of the fin-type active pattern 120 which protrudes upward from the device isolation layer 110 may also be formed by an epitaxial process. After the device isolation layer 110 is formed, the upper part 120b of the fin-type active pattern 120 may be formed by an epitaxial process using an upper portion of the fin-type active pattern 120 exposed by the device isolation layer 110 as a seed.

A doping process may be performed on the fin-type active pattern 120, and thus, a threshold voltage may be adjusted. When a semiconductor device 10 obtained by the method for fabricating a semiconductor device according to an exemplary embodiment is an NMOS transistor, the fin-type active pattern 120 may be doped with impurities such as boron (B). When the semiconductor device 10 is a PMOS transistor, the fin-type active pattern 120 may be doped with impurities such as phosphorous (P) or arsenic (As).

The fin-type active pattern 120 extending in the second direction Y includes a first region I in which a gate pattern is later formed and a second region II in which a source/drain is later formed. The second region II of the fin-type active pattern 120 is disposed on both sides of the first region I of the fin-type active pattern 120.

Figure 7:
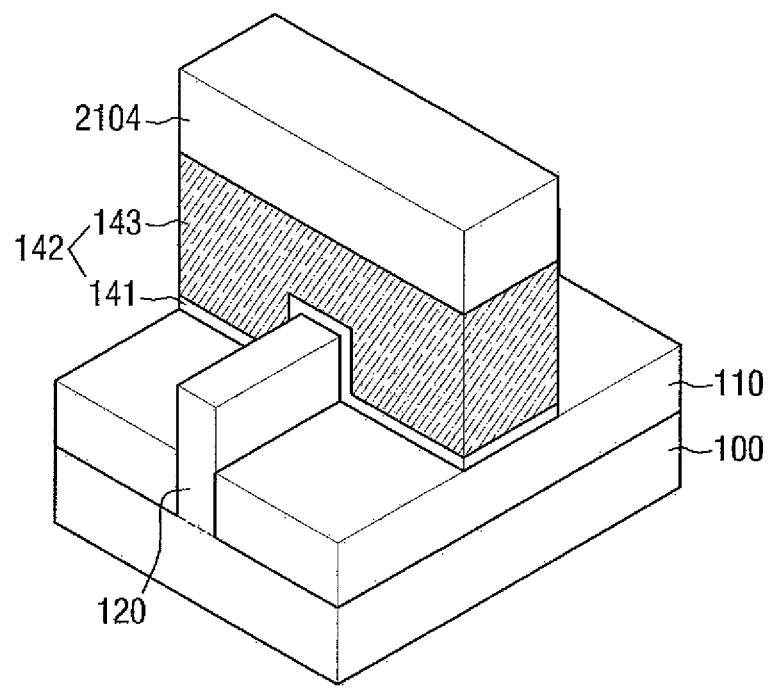

Referring to FIGS. 6 and 7, an etching process is performed using a third mask pattern 2104. As a result, a dummy gate pattern 142 may intersect the fin-type active pattern 120 and extend in a first direction X.

Accordingly, the dummy gate pattern 142 is formed on the fin-type active pattern 120. The dummy gate pattern 142 may partially overlap the fin-type active pattern 120. The fin-type active pattern 120 includes a portion covered by the dummy gate pattern 142 and a portion exposed by the dummy gate pattern 142. The dummy gate pattern 142 covers side surfaces and a top surface of the upper part 120b of the fin-type active pattern 120 which protrudes upward from the device isolation layer 110.

For example, the dummy gate pattern 142 overlaps the first region I of the fin-type active pattern 120. The second region II of the fin-type active pattern 120 is not overlapped by the dummy gate pattern 142 but is exposed.

The dummy gate pattern 142 includes a dummy gate insulating layer 141 and a dummy gate electrode 143. For example, the dummy gate insulating layer 141 may be a silicon oxide layer, and the dummy gate electrode 143 may be polysilicon.

A thickness of the third mask pattern 2104 may be greater than a height of the protruding upper part 120b of the fin-type active pattern 120. The third mask pattern 2104 may include a nitride layer and/or an oxynitride layer.

Figure 8:
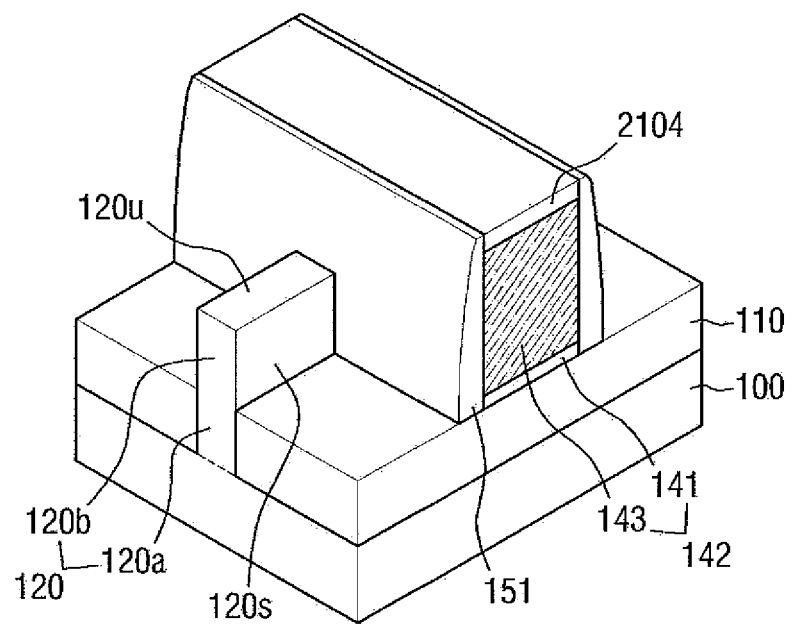

Referring to FIG. 8, a gate spacer 151 is formed on side surfaces of the dummy gate pattern 142. The gate spacer 151 is formed on side surfaces of the dummy gate insulating layer 141 and the dummy gate electrode 143.

However, no spacer is formed on side surfaces 120s of the fin-type active pattern 120 which do not overlap the dummy gate pattern 142. For example, no space is formed on the side surfaces 120s of the second region II of the fin-type active pattern 120.

An insulating layer is formed on the dummy gate pattern 142 and the fin-type active pattern 120. Then, the gate spacer 151 is formed by etching the insulating layer.

When the gate spacer 151 is formed, a spacer may be formed on the side surfaces 120s of the second region II of the fin-type active pattern 120. An additional etching process is performed to thus remove the spacer formed on the side surfaces 120s of the second region II of the fin-type active pattern 120. The additional etching process is continued until the spacer formed on the side surfaces 120s of the second region II of the fin-type active pattern 120 is removed. During the additional etching process, the gate spacer 151 formed on the side surfaces of the dummy gate pattern 142 and the third mask pattern 2104 may also be etched. Referring to FIGS. 7 and 8, the height of the third mask pattern 2104 is reduced by the additional etching process that removes the spacer formed on the side surfaces 120s of the second region II of the fin-type active pattern 120. Since the thickness of the third mask pattern 2104 is greater than the height of the upper part 120b of the fin-type active pattern 120, the dummy gate electrode 143 is not exposed despite the additional etching process.

Thus, while the gate spacer 151 is formed on the side surfaces of the dummy gate pattern 142, no spacer is formed on the side surfaces 120s of the fin-type active pattern 120 which do not overlap the dummy gate pattern 142. Therefore, the side surfaces 120s of the second region II of the fin-type active pattern 120 and a top surface 120u of the second region II of the fin-type active pattern 120 are exposed.

Figure 9:
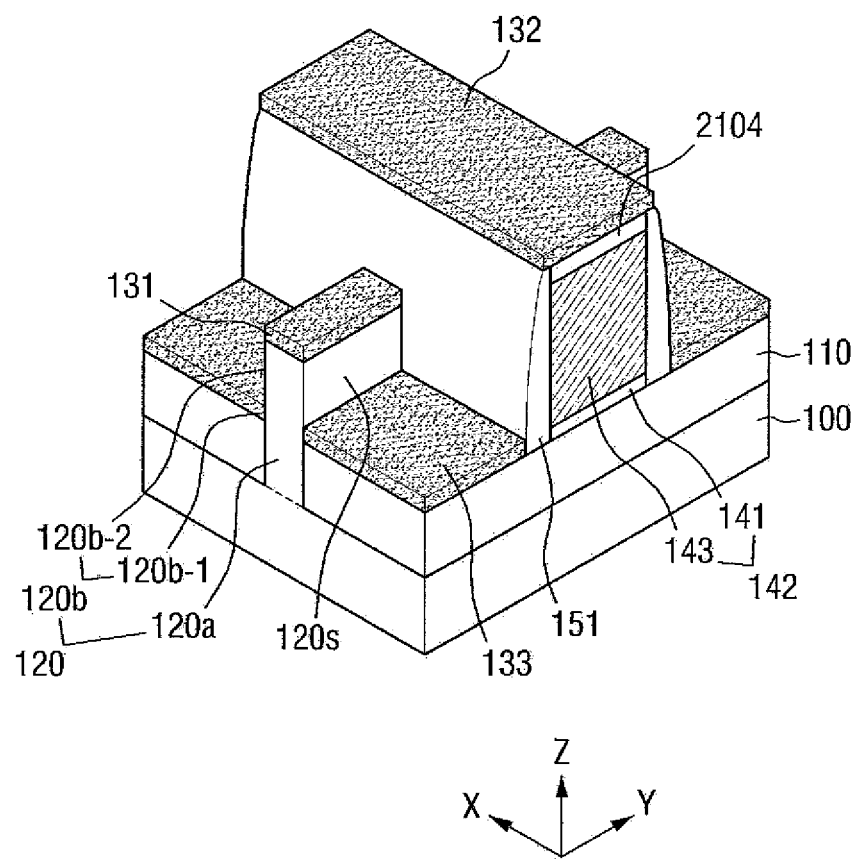

Referring to FIG. 9, a blocking pattern 131 is formed on a portion of the fin-type active pattern 120 which does not overlap the dummy gate pattern 142.

The first blocking pattern 131 is formed on the top surface of the portion of the fin-type active pattern 120 which does not overlap the dummy gate pattern 142 but is not formed on the side surfaces of the portion of the fin-type active pattern 120 which does not overlap the dummy gate pattern 142.

For example, the first blocking pattern 131 exposes the side surfaces 120s of the second region II of the fin-type active pattern 120 and covers the top surface 120u of the second region II of the fin-type active pattern 120.

The first blocking pattern 131 may be formed using a directional deposition process. The directional deposition process may be, but is not limited to, an ion implantation process (IIP) using a cluster ion source and/or a deposition process using a plasma source that is rendered to have straightness by a bias applied to the plasma source. For example, any directional deposition process that may provide straightness to a layer when the layer is deposited may be used for forming the first blocking pattern 131.

The first blocking pattern 131 may include a silicon oxide layer, a silicon nitride layer, and/or a silicon oxynitride layer.

A second blocking pattern 132 is formed on a top surface of the dummy gate pattern 142, and a third blocking pattern 133 is formed on the device isolation layer 110. The second blocking pattern 132 is formed on the third mask pattern 2104. The second blocking pattern 132 and the third blocking pattern 133 are formed at the same or substantially the same level as the first blocking pattern 131. The second blocking pattern 132 and the third blocking pattern 133 being formed at "the same or substantially the same level" as the first blocking pattern 131 may mean that the second blocking pattern 132 and the third blocking pattern 133 are formed by the same or substantially the same fabrication process.

Since the second blocking pattern 132 is formed by the directional deposition process, the second blocking pattern 132 is formed on the top surface of the dummy gate pattern 142 but is not formed on the side surfaces of the dummy gate pattern 142.

The third blocking pattern 133 formed on the device isolation layer 110 may partially contact the side surfaces of the portion of the fin-type active pattern 120 which does not overlap the dummy gate pattern 142. For example, the third blocking pattern 133 may partially contact the side surfaces 120s of the second region II of the fin-type active pattern 120.

The upper part 120b of the fin-type active pattern 120 includes a first portion 120b-1 and a second portion 120b-2. The first portion 120b-1 of the upper part 120b of the fin-type active pattern 120 contacts the third blocking pattern 133. The second portion 120b-2 of the upper part 120b of the fin-type active pattern 120 does not contact the third blocking pattern 133. Therefore, side surfaces of the second portion 120b-2 of the upper part 120b of the fin-type active pattern 120 are exposed.

Figure 10:
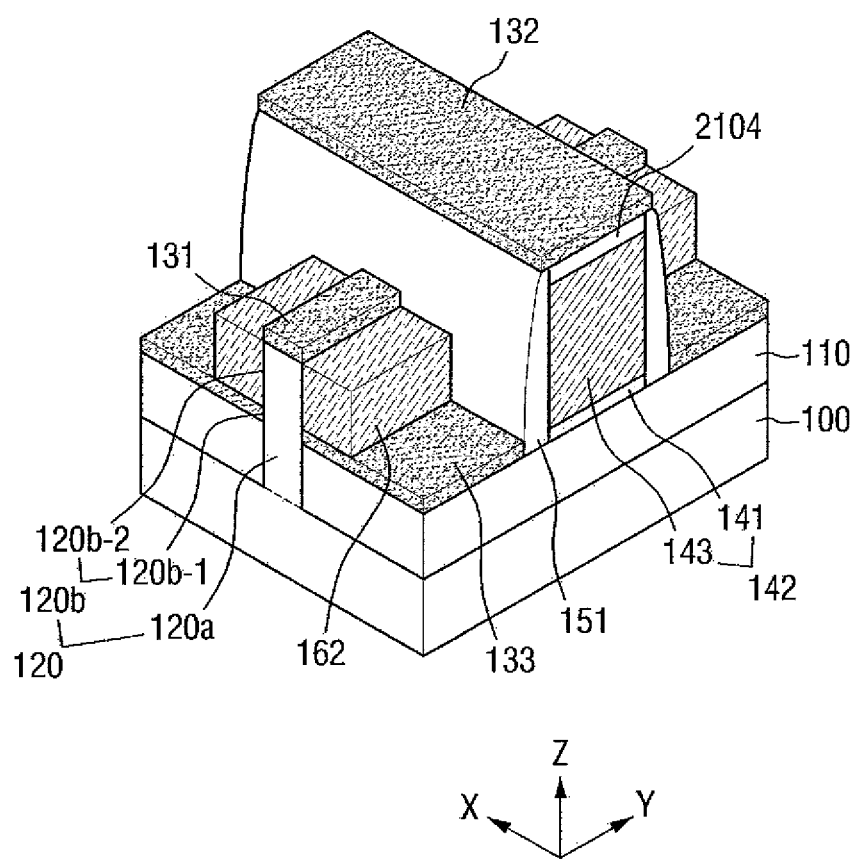

Referring to FIG. 10, a semiconductor pattern 162 is formed on the exposed side surfaces of the fin-type active pattern 120. The semiconductor pattern 162 is formed on the side surfaces of the second portion 120b-2 of the upper part 120b of the fin-type active pattern 120 which are not covered with the first blocking pattern 131 and the third blocking pattern 133.

The semiconductor pattern 162 is formed on the portion of the fin-type active pattern 120 which does not overlap the dummy gate pattern 142, for example, on the side surfaces 120s of the second region II of the fin-type active pattern 120. The semiconductor pattern 162 is formed on portions of the side surfaces 120s of the second region II of the fin-type active pattern 120 which do not contact the third blocking pattern 133.

The semiconductor pattern 162 extends in the first direction X from the side surfaces 120s of the second region II of the fin-type active pattern 120. Therefore, the semiconductor pattern 162 partially overlaps the third blocking pattern 133. That is, the whole bottom surface of the semiconductor pattern 162 overlaps the third blocking pattern 133.

The semiconductor pattern 162 grows from the side surfaces 120s of the second region II of the fin-type active pattern 120 which are not covered by the third blocking pattern 133. Therefore, the semiconductor pattern 162 is separated from the device isolation layer 110 by a thickness of the third blocking pattern 133.

The semiconductor pattern 162 may be formed by a selective epitaxial growth (SEG) process. The semiconductor pattern 162 formed by the SEG process is an epitaxial layer. The SEG process may be, but is not limited to, a chemical vapor deposition (CVD) process, a reduced pressure chemical vapor deposition (RPCVD) process, or an ultra-high vacuum chemical vapor deposition (UHVCVD) process.

When the semiconductor pattern 162 is a silicon epitaxial layer, the SEG process may be performed with a source gas. Examples of the source gas may include silane ($SiH_4$), dichlorosilane ($SiH_2Cl_2$; DCS), and trichlorosilane ($SiHCl_3$; TCS). In the SEG process, a gas containing Cl atoms, such as HCl or $Cl_2$, may be supplied in addition to the source gas. The Cl atom-containing gas additionally supplied during the SEG process may increase the selectivity of the SEG process performed on the side surfaces 120s of the second region II of the fin-type active pattern 120.

When the semiconductor device 10 is an NMOS fin-type transistor, the semiconductor pattern 162 may be formed by doping n-type dopants (such as phosphorous or arsenic) and by performing an SEG process. When the semiconductor device 10 is an NMOS fin-type transistor, the semiconductor pattern 162 may be formed by doping p-type dopants (such as boron) and by performing an SEG process.

The semiconductor pattern 162 and the second portion 120b-2 of the upper part 120b of the fin-type active pattern 120 on which the semiconductor pattern 162 is selectively epitaxially grown become a source/drain 161 (see FIG. 11) of the semiconductor device 10. For example, the semiconductor pattern 162 is formed on the second portion 120b-2 of the upper part 120b of the fin-type active pattern 120, and the source/drain 161 may be wider than the fin-type active pattern 120.

Figure 11:
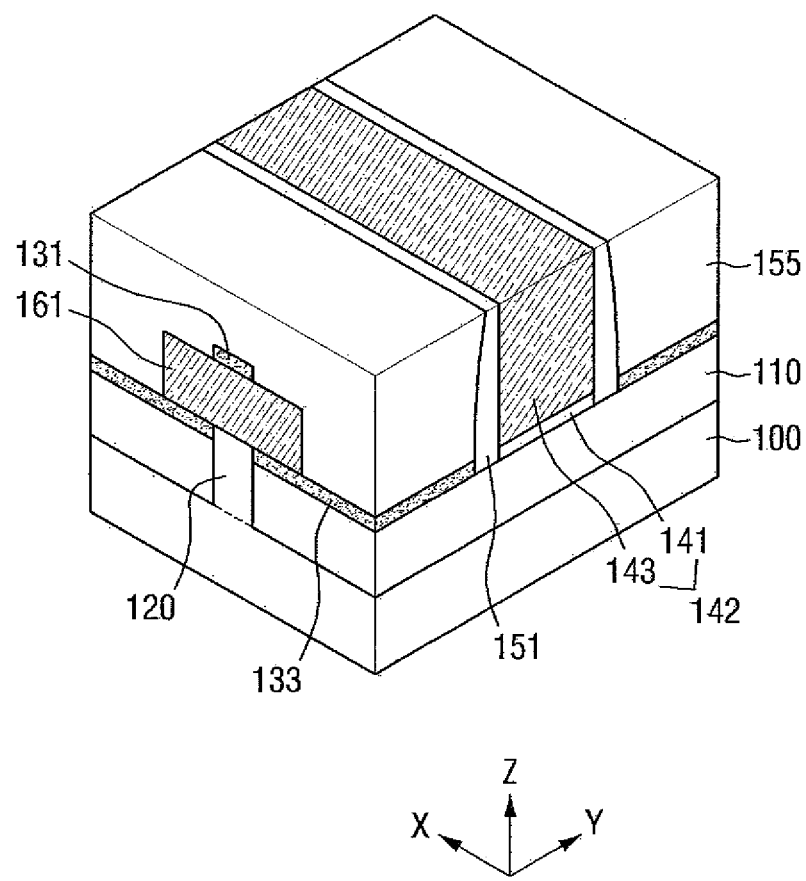

Referring to FIG. 11, an interlayer insulating film 155 is formed on the structure shown in FIG. 10. The interlayer insulating film 155 may include an oxide layer, a nitride layer, and/or an oxynitride layer.

The interlayer insulating film 155 covers the first blocking pattern 131 on the source/drain 161, the second blocking pattern 132 on the dummy gate pattern 142, and the third blocking pattern 133 on the device isolation layer 110.

The interlayer insulating film 155 is planarized until the top surface of the dummy gate pattern 142 is exposed. As a result, the second blocking pattern 132 and the third mask pattern 2104 may be removed, and the top surface of the dummy gate pattern 142 may be exposed.

Figure 12:
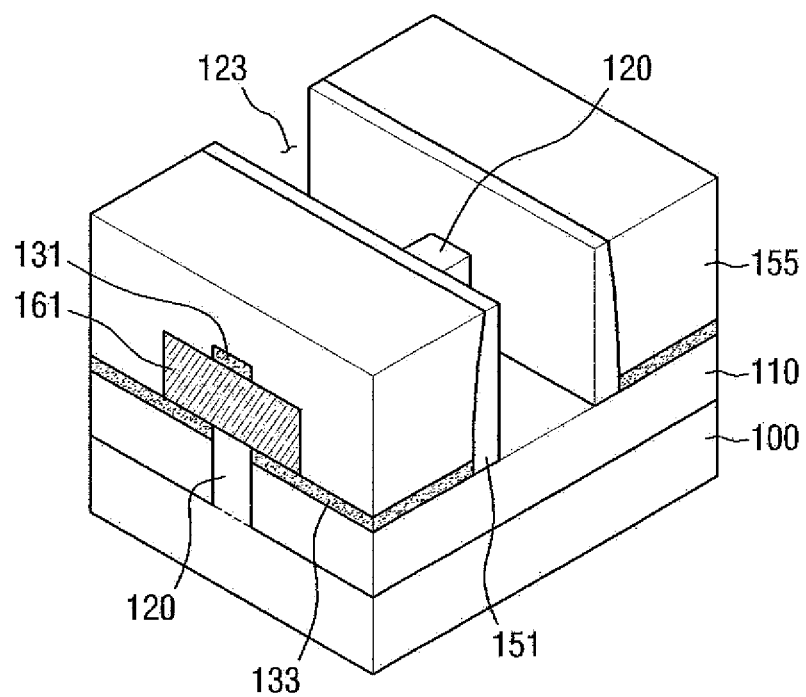

Referring to FIG. 12, the dummy gate pattern 142 including the dummy gate insulating layer 141 and the dummy gate electrode 143 are removed.

Thus, a trench 123 is formed which partially exposes the device isolation layer 110 and the fin-type active pattern 120.

Figure 13:
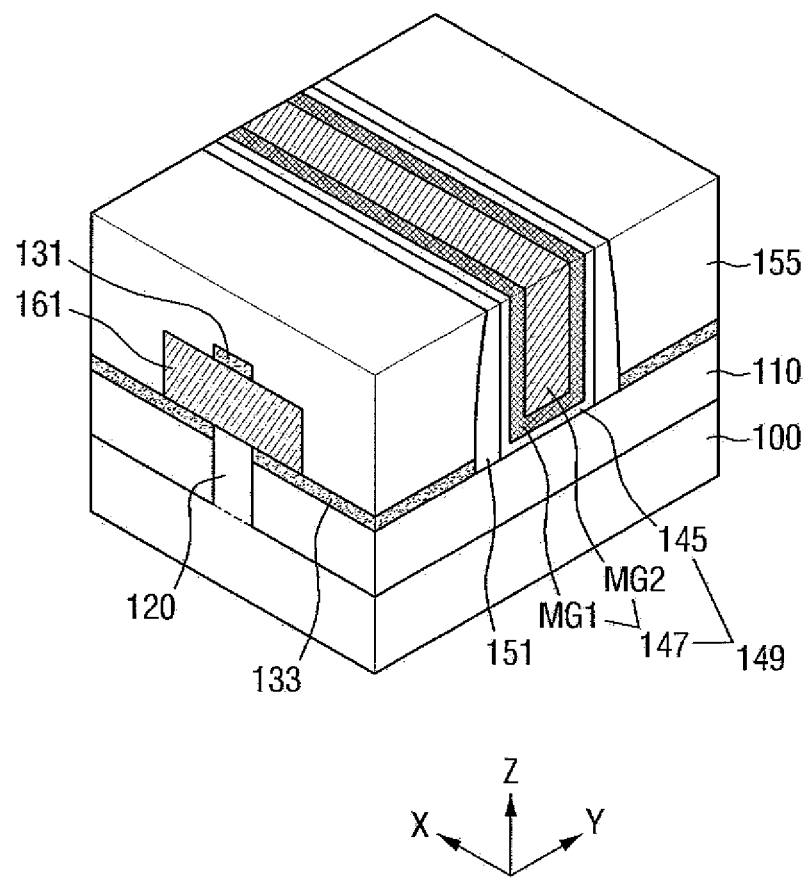

Referring to FIG. 13, a gate insulating layer 145 and a gate electrode 147 are formed in the trench 123, thereby forming a gate pattern 149.

The gate insulating layer 145 may include a high-k material having a higher dielectric constant than a silicon oxide layer. The gate insulating layer 145 may be formed substantially conformally along sidewalls and a bottom surface of the trench 123.

The gate electrode 147 may include first and second metal layers MG1 and MG2. As illustrated in FIG. 13, the gate electrode 147 may include a stack of two or more metal layers (for example, the first and second metal layers MG1 and MG2). The first metal layer MG1 adjusts a work function, and the second metal layer MG2 fills the space formed by the first metal layer MG1. As an example, the first metal layer MG1 may include TiN, TaN, TiC and/or TaC, and the second metal layer MG2 may include tungsten (W) or aluminum (Al). The gate electrode 147 may also be formed of a nonmetallic material, such as Si or SiGe.

A method of fabricating a semiconductor device according to an exemplary embodiment of the present invention is now described with reference to FIGS. 2 through 10, 14 and 15.

Figure 14:
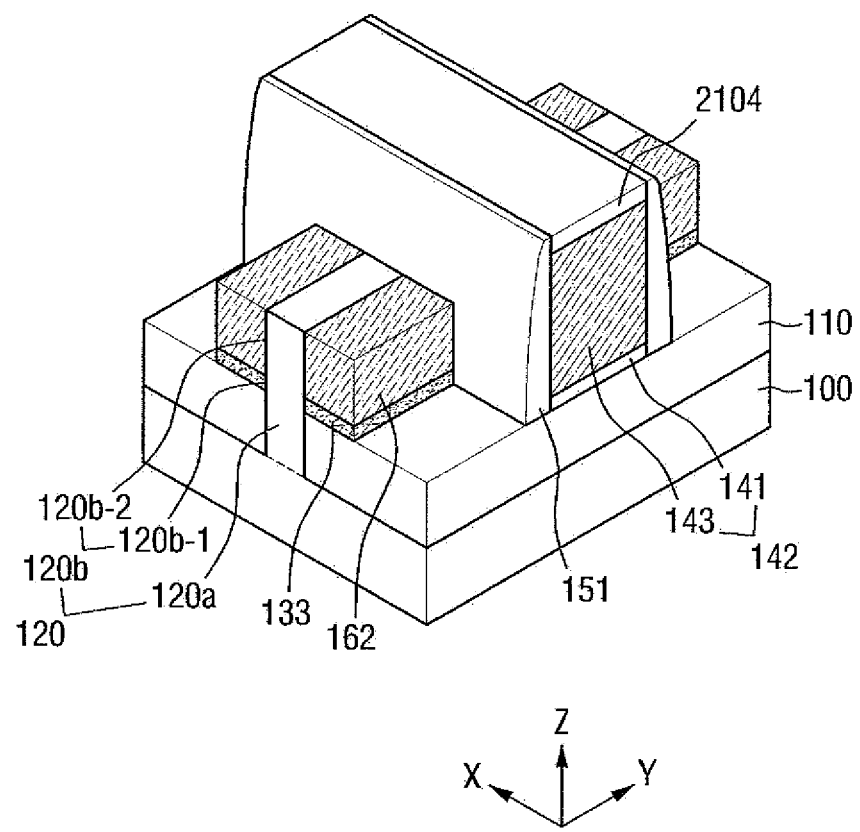
FIGS. 14 and 15 are views illustrating steps of a method of fabricating a semiconductor device according to an exemplary embodiment of the present invention.
Figure 15:
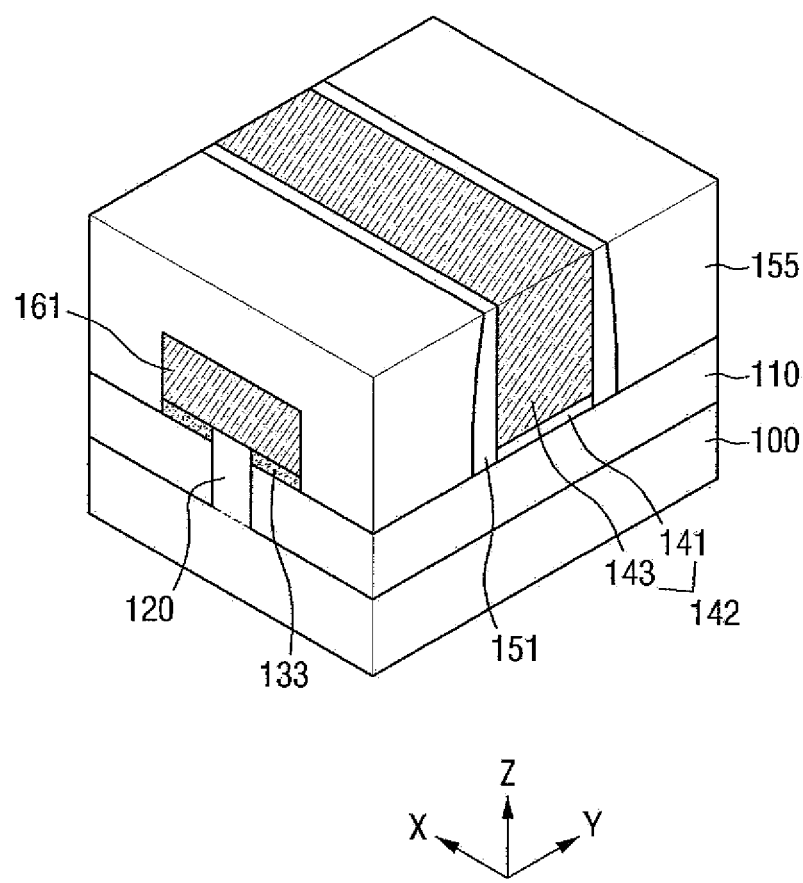

FIGS. 14 and 15 are views illustrating steps of a method of fabricating a semiconductor device according to an exemplary embodiment of the present invention.

Referring to FIG. 14, an etching process is performed using a semiconductor pattern 162 as a mask. As a result, a portion of a third blocking pattern 133 which is not overlapped by the semiconductor pattern 162 is removed. Thus, a device isolation layer 110 is exposed.

Accordingly, a width of the third blocking pattern 133 interposed between the semiconductor pattern 162 and the device isolation layer 110 is substantially equal to a thickness of the semiconductor pattern 162 formed on side surfaces of a second portion 120b-2 of an upper part 120b of a fin-type active pattern 120.

As the third blocking pattern 133 is partially removed, a second blocking pattern 132 formed on a dummy gate pattern 142 and a first blocking pattern 131 formed on a portion of the fin-type active pattern 120 which does not overlap the dummy gate pattern 142 are also removed. Accordingly, a top surface of the portion of the fin-type active pattern 120 which does not overlap the dummy gate pattern 142 and a third mask pattern 2104 are exposed.

Referring to FIG. 15, an interlayer insulating film 155 is formed on the structure shown in FIG. 14.

Since the first blocking pattern 131 and the second blocking pattern 132 were removed, the interlayer insulating film 155 covers the source/drain 161 having the remaining third blocking pattern 133 thereunder and the third mask pattern 2104.

The interlayer insulating film 155 is planarized until a top surface of the dummy gate pattern 142 is exposed. As a result, the third mask pattern 2104 may be removed, and the top surface of the dummy gate pattern 142 may be exposed.

In the method of fabricating a semiconductor device according to an exemplary embodiment, the third blocking pattern 133 and the interlayer insulating film 155 may include, but are not limited to, different materials from each other.

A trench 123 is formed by removing the dummy gate pattern 142. A gate pattern 149 is formed in the trench 123.

A method of fabricating a semiconductor device according to an exemplary embodiment of the present invention is now described with reference to FIGS. 2 through 6, 8 through 11 and 16.

Figure 16:
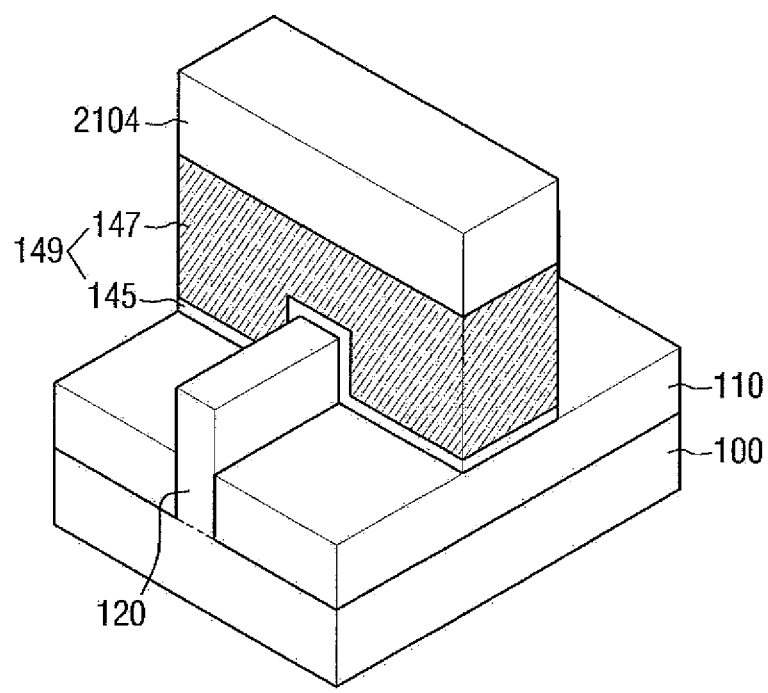
FIG. 16 is a view illustrating steps of a method of fabricating a semiconductor device according to an exemplary embodiment of the present invention.

FIG. 16 is a view illustrating steps of a method of fabricating a semiconductor device according to an exemplary embodiment of the present invention.

Referring to FIG. 16, a gate pattern 149 may intersect a fin-type active pattern 120, which protrudes upward from a device isolation layer 110, and extend in a first direction X.

For example, the gate pattern 149 may intersect the fin-type active pattern 120 by performing an etching process using a third mask pattern 2104.

The gate pattern 149 includes a gate insulating layer 145 and a gate electrode 147. In the method of fabricating a semiconductor device according to an exemplary embodiment, a gate pattern replacement process is not necessarily performed after the formation of a source/drain 161.

The source/drain 161 is formed on both sides of the gate pattern 149 by the processes described above in connection with FIGS. 8 through 11.

According to an exemplary embodiment of the present invention, a blocking pattern (e.g., the first blocking pattern 131 in FIG. 1) may be formed on the top surface of a fin-type active pattern (e.g., the fin-type active pattern 120 in FIG. 1), and then, a semiconductor pattern including a drain and a source may be formed on side surfaces of the fin-type active pattern by, e.g., a selective epitaxial growth (SEP) process. Thus, the semiconductor pattern including the source and drain may have an increased width, with the height thereof left unchanged.

Figure 17:
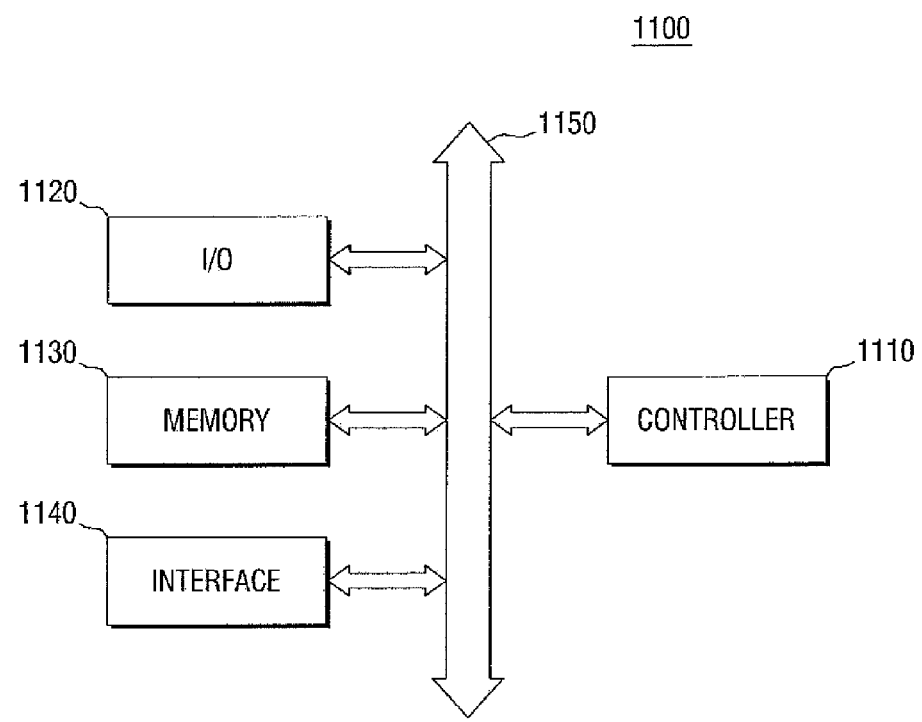
FIG. 17 is a block diagram illustrating an electronic system including semiconductor devices according to exemplary embodiments of the present invention.

FIG. 17 is a block diagram of an electronic system 1100 including semiconductor devices according to an exemplary embodiment of the present invention.

Referring to FIG. 17, the electronic system 1100 according to an exemplary embodiment of the present invention may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may function as a path for transmitting data.

The controller 1110 may include a microprocessor, a digital signal processor, a microcontroller and logic devices capable of performing similar functions to those of a microprocessor, a digital signal processor and/or a microcontroller. The I/O device 1120 may include a keypad, a keyboard and a display device. The memory device 1130 may store data and/or commands. The interface 1140 may be used to transmit or receive data to/from a communication network. The interface 1140 may be a wired or wireless interface. As an example, the interface 1140 may include an antenna or a wired or wireless transceiver. The electronic system 1100 may be an operation memory for increasing the operational performance of the controller 1110, and may also include a high-speed dynamic random access memory (DRAM) or static random access memory (SRAM). Fin field effect transistors (FinFETs) according to exemplary embodiments of the present invention may be provided in the memory device 1130 or in the controller 1110 or in the I/O device 1120.

The electronic system 1100 may be applicable to any type of electronic products capable of transmitting or receiving information in a wireless environment, such as a personal digital assistant (PDA), a portable computer, a web tablet, a wireless phone, a mobile phone, a digital music player, a memory card, etc.

Figure 18:
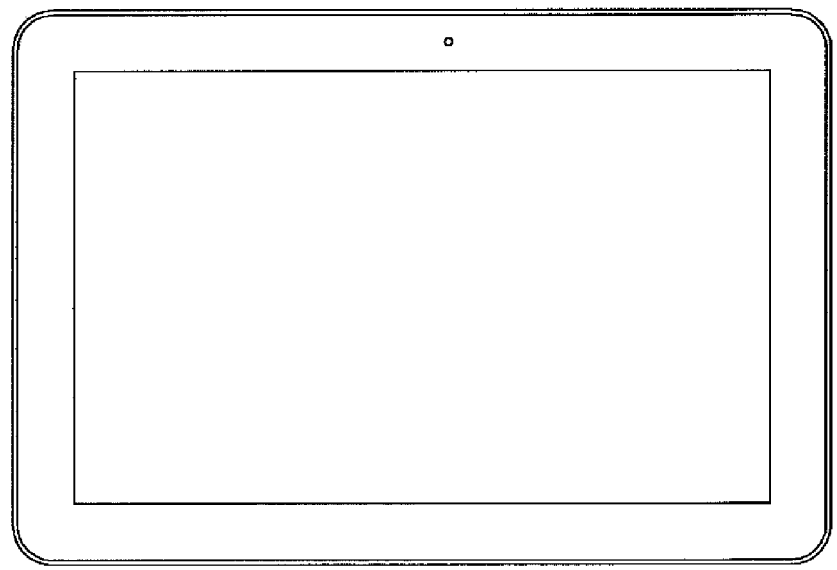
FIGS. 18 and 19 are diagrams illustrating examples of a semiconductor system to which semiconductor devices according to exemplary embodiments of the present invention can be applied.
Figure 19:
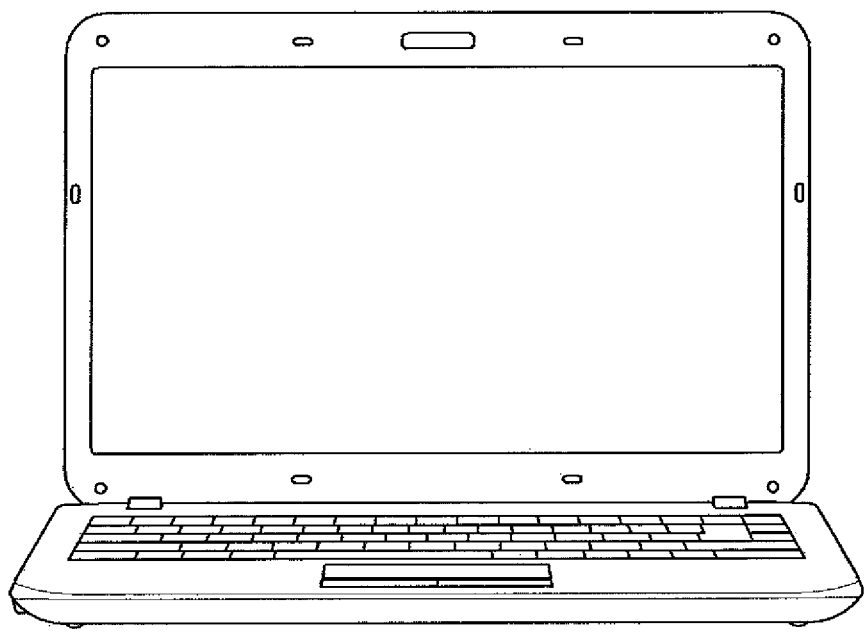

FIGS. 18 and 19 are diagrams illustrating examples of a semiconductor system to which semiconductor devices according to exemplary embodiments of the present invention can be applied. FIG. 18 illustrates a tablet personal computer (PC), and FIG. 19 illustrates a laptop computer. At least one of the semiconductor devices according to exemplary embodiments of the present invention, as set forth herein, may be used in a tablet PC or in a laptop computer. The semiconductor devices according to exemplary embodiments of the present invention, as set forth herein, may also be applicable to various other integrated circuit (IC) devices.

While exemplary embodiments of the present invention have been shown and described with reference to the figures, it will be understood by those of ordinary skill in the art that various changes in form and detail may be made thereto without departing from the spirit and scope of the present invention.

What is claimed is:

1. A method for fabricating a semiconductor device, the method comprising:
   forming a dummy gate pattern intersecting a fin-type active pattern protruding upward from a device isolation layer;
   forming a first blocking pattern on at least a portion of the fin-type active pattern, wherein the first blocking pattern does not overlap the dummy gate pattern and exposes side surfaces of the portion of the fin-type active pattern;
   forming a semiconductor pattern on the exposed side surfaces of the portion of the fin-type active pattern after forming the first blocking pattern;
   forming an insulating layer which covers the dummy gate pattern and the fin-type active pattern after forming the dummy gate pattern and before forming the first blocking pattern; and
   forming a spacer on side surfaces of the dummy gate pattern by etching the insulating layer.

2. The method of claim 1, wherein forming the first blocking pattern uses a directional deposition process.

3. The method of claim 2, wherein forming the first blocking pattern uses at least one of an ion implantation process (IIP) using a cluster ion source and a deposition process using a plasma source.

4. The method of claim 1, wherein forming the first blocking pattern comprises forming the first blocking pattern on a top surface of a portion of the fin-type active pattern which does not overlap the dummy gate pattern.

5. The method of claim 1, wherein forming the first blocking pattern comprises forming a second blocking pattern on a top surface of the dummy gate pattern and a third blocking pattern on the device isolation layer.

6. The method of claim 5, wherein the fin-type active pattern comprises an upper part and a lower part, wherein the third blocking pattern contacts the lower part of the fin-type active pattern, and wherein the semiconductor pattern is formed on side surfaces of the upper part of the fin-type active pattern.

7. The method of claim 5, further comprising:
   forming an interlayer insulating film, which covers the semiconductor pattern and the second blocking pattern, on the device isolation layer; and
   removing the second blocking pattern and exposing the top surface of the dummy gate pattern by planarizing the interlayer insulating film.

8. The method of claim 5, further comprising:
   exposing the device isolation layer by removing a portion of the third blocking pattern which is not overlapped by the semiconductor pattern;
   forming an interlayer insulating film which covers the semiconductor pattern and the dummy gate pattern after exposing the device isolation layer; and
   exposing the top surface of the dummy gate pattern by planarizing the interlayer insulating film.

9. The method of claim 1, further comprising:
   forming a trench by removing the dummy gate pattern after forming the semiconductor pattern; and
   forming a gate insulating layer and a gate electrode in the trench.

10. The method of claim 1, wherein forming the semiconductor pattern uses a selective epitaxial growth (SEG) process.

11. A method for fabricating a semiconductor device, the method comprising:
    forming a fin-type active pattern extending in a first direction and protruding upward from a device isolation layer, wherein the fin-type active pattern comprises a first region and a second region disposed on two opposite sides of the first region;
    forming a dummy gate pattern which extends in a second direction different from the first direction and which overlaps the first region of the fin-type active pattern;
    forming a first blocking pattern which exposes side surfaces of the second region of the fin-type active pattern, wherein the first blocking pattern covers a top surface of the second region of the fin-type active pattern without covering a top surface of the first region of the fin-type active pattern, wherein the first blocking pattern is not interposed between the dummy gate pattern and the fin-type active pattern; and
    forming a source/drain by selectively growing an epitaxial layer on the side surfaces of the second region of the fin-type active pattern after forming the first blocking pattern.

12. The method of claim 11, wherein forming the first blocking pattern uses a directional deposition process.

13. The method of claim 11, wherein forming the first blocking pattern comprises forming a second blocking pattern on a top surface of the dummy gate pattern and a third blocking pattern on the device isolation layer.

14. The method of claim 13, wherein the epitaxial layer at least partially overlaps the third blocking pattern.

15. A method for fabricating a semiconductor device, the method comprising:
    forming a fin-type active pattern on a substrate, wherein the fin-type active pattern protrudes substantially perpendicular to the substrate and includes a first portion and a second portion positioned at two opposite sides of the first portion;
    forming a blocking pattern on an upper surface of the second portion;
    forming a semiconductor pattern on two opposite side surfaces of the second portion, wherein the two opposite side surfaces of the second portion abut the first portion, after forming the blocking pattern; and
    forming a dummy gate pattern on the first portion of the fin-type active pattern, wherein the blocking pattern is not interposed between the dummy gate pattern and the fin-type active pattern.

16. The method of claim 15, wherein the blocking pattern is formed by a directional deposition process.

17. The method of claim 15, wherein the blocking pattern is formed by at least one of an ion implantation process and a plasma deposition process.

18. The method of claim 15, wherein the semiconductor pattern is formed by performing a selective epitaxial growth (SEG) process on the two opposite side surfaces of the second portion.

19. The method of claim 15, wherein the fin-type active pattern and the semiconductor pattern each include substantially the same material.

* * * * *